(12) United States Patent
Ruth

(10) Patent No.: US 8,138,765 B2
(45) Date of Patent: Mar. 20, 2012

(54) DEVICE AND METHOD FOR ACTUATOR MONITORING OF A SAFETY-RELATED LOAD CIRCUIT CONNECTED WITH TWO CHANNELS

(75) Inventor: Olaf Ruth, Blomberg (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 853 days.

(21) Appl. No.: 12/212,909

(22) Filed: Sep. 18, 2008

(65) Prior Publication Data

US 2009/0091330 A1 Apr. 9, 2009

(30) Foreign Application Priority Data

Oct. 5, 2007 (DE) .................. 10 2007 048 122

(51) Int. Cl.
*G01R 31/02* (2006.01)
(52) U.S. Cl. ....................................... 324/537
(58) Field of Classification Search .................. None
See application file for complete search history.

(56) References Cited

U.S. PATENT DOCUMENTS 5,559,438 A * 9/1996 Bedouet et al. ............... 324/418
6,297,569 B1 10/2001 Bartels et al.

FOREIGN PATENT DOCUMENTS

| DE | 19951957 A1 | 10/2000 |
| EP | 0609158 A1 | 8/1994 |
| EP | 0665479 A1 | 8/1995 |
| EP | 0913938 A1 | 5/1999 |
| EP | 1873916 A2 | 1/2008 |

OTHER PUBLICATIONS

RA Renger, "De Patent Application No. 10 2007 048 122.7-32 Office Action", Sep. 29, 2008, Publisher: German Patent and Trademark Office, Published in: DE.
Siemens, "Sinumerik 840D/Simodrive 611 digital", "Sinumerik Safety Integrated, Function Description", 2006, pp. 3-49, 3-50, 4-71, 4-72, 5-224 to 5-227, 10-490, 10-516 to 10-535, vol. 03, No. 06, Publisher: Siemens AG, Published in: DE.
Josef Schriefl, "European Office Action for application No. 08016519.4-2206", Feb. 5, 2010, Publisher: EPO, Published in: EP.
Josef Schriefl, "EP Patent Application No. EP 08 01 6519 Office Action", Feb. 5, 2009, Publisher: EPO, Published in: EP.

* cited by examiner

*Primary Examiner* — Paresh Patel
(74) *Attorney, Agent, or Firm* — DeMont & Breyer, LLC

(57) ABSTRACT

The invention relates to monitoring actuators arranged in the load circuit of an output circuit for switching the load circuit. Actuators are arranged in series in the load circuit, each of the actuators is connected to a control and evaluation device by a separate channel for individual control, wherein an auxiliary contact is assigned to each actuator. The contacts are connected via a readback circuit to the device such that when all the actuators assigned to a readback circuit are deactivated, a standby signal is detected as a readback signal by the device, wherein the device is parameterized such that, for their activation, the control of actuators in the load circuit comprises the steps that only one actuator belonging to a readback circuit is always activated and the readback signal detected by the readback circuit assigned to this actuator is evaluated and the actuators in the load circuit remains deactivated.

19 Claims, 4 Drawing Sheets

| Sequenz | 10 | 20 | RS |
|---|---|---|---|
| 1 | OFF | OFF | TRUE |
| 2-a | ON | OFF | FALSE |
| 2-b | OFF | OFF | TRUE |
| 2-c | OFF | ON | FALSE |
| 2-d | OFF | OFF | TRUE |
| 3-a | ON oder OFF | OFF | FALSE |
| 3-b | ON | ON | FALSE |
| 4 | OFF | OFF | TRUE |
| 5 | ON OFF | OFF ON | FALSE |

Fig.2

| Sequenz | 10 | 20 | RS1 | RS2 |
|---|---|---|---|---|
| 1 | OFF | OFF | TRUE | TRUE |
| 2-a | ON | OFF | FALSE | TRUE |
| 2-b | OFF | OFF | TRUE | TRUE |
| 2-c | OFF | ON | TRUE | FALSE |
| 2-d | OFF | OFF | TRUE | TRUE |
| 3-a | ON oder OFF | OFF ON | FALSE TRUE | TRUE FALSE |
| 3-b | ON | ON | FALSE | FALSE |
| 4 | OFF | OFF | TRUE | TRUE |
| 5 | ON OFF | OFF ON | FALSE TRUE | TRUE FALSE |

Fig.4

DEVICE AND METHOD FOR ACTUATOR MONITORING OF A SAFETY-RELATED LOAD CIRCUIT CONNECTED WITH TWO CHANNELS

FIELD OF THE INVENTION

The invention relates to a method and to devices for monitoring actuators arranged in series in a load circuit for switching the load circuit.

BACKGROUND OF THE INVENTION

For the output of safety-relevant signals to actuators, such as, for example, contactors, motors, relays, etc., for switching, i.e., for activating or deactivating a load circuit for performing a certain safety-related application, in particular, in safety engineering, strict requirements are placed on error recognition and failure behavior of the circuit, as well as the peripherals, which must also satisfy, for example, DIN EN 954-1 or IEC 61508 standards. For satisfying these requirements, typically two-channel structures are used for controlling the load circuit.

These two-channel structures are based on the fact that two or more actuators are integrated into the load circuit for generating safety-relevant redundancy and are controlled specific to the application. For monitoring proper switching, as a rule, there are readback circuits connected to the actuators. For testing and monitoring such two-channel structures, for certain states of the actuators, corresponding readback signals are detected and evaluated by means of a readback circuit.

For performing certain tests, if control signals must be output to the actuators, they are frequently visible on the output and can consequently interfere with a connected load. This also applies, for example, when the test phase is kept rather short, because, for example, even for fast-running machines connected via the load circuit, in which, for example, a linear motor is used, only a few milliseconds are required for them to reach their final velocity. Consequently, in such cases, conventionally only one test or one monitoring sequence is performed before the actual use of the circuit structures and not during the use for safety-related application specific to the application.

SUMMARY OF THE INVENTION

One essential problem of the invention is to allow the monitoring of actuators, to which safety-relevant signals are output for switching a two-channel or multiple-channel load circuit controlled by means of the actuators in a simple way and also safety-related requirements are met sufficiently at each point in time, so that this also satisfies DIN EN 954-1 or IEC 61508 standards.

Other problems solved by the subject matter reproduced in the claims are to be seen in that switching as such and/or reaction times of the actuators can be tested in the field and preferably also directly before performance of a required safety function.

Consequently, the invention proposes a method for testing actuators arranged in the load circuit of an output circuit for switching the load circuit, in which a number of actuators are arranged in series in the load circuit, wherein each of the actuators is connected to a control and evaluation device (SA) and an auxiliary contact is assigned to each actuator, wherein the auxiliary contacts are connected by means of at least one readback circuit to the control and evaluation device in such a way that only by deactivating all of the actuators assigned to each readback circuit, a standby signal is detected as the readback signal by the control and evaluation device by means of this readback circuit, and wherein the control and evaluation device is parameterized in such a way that the control of actuators arranged in series in the load circuit comprises, for their activation, the steps that, with reference to at least one readback circuit, initially only one actuator belonging to this readback circuit is always activated and the readback signal detected by means of the readback circuit assigned to this actuator is evaluated and at least one of the actuators arranged in series in the load circuit remains deactivated at least as long.

The invention further provides a control and evaluation system for testing actuators arranged in series in the load circuit of an output circuit for switching the load circuit, which comprises a control and evaluation device and each of the actuators is connected to the control and evaluation device by means of a separate control channel for individual control and an auxiliary contact is assigned to each actuator, wherein the auxiliary contacts are connected to the control and evaluation device by means of at least one readback circuit in such a way that only by deactivating all of the actuators assigned to a readback circuit, a standby signal can be detected as a readback signal by the control and evaluation device by means of this readback circuit and wherein the control and evaluation device is parameterized and/or can be parameterized, such that by controlling actuators arranged in series in the load circuit, for their activation, initially with reference to at least one readback circuit, only one actuator belonging to this readback circuit can always be activated and the readback signal detected by means of the readback circuit assigned to this actuator is to be evaluated before at least the last of the actuators arranged in series in the load circuit can be activated.

The invention also proposes a control and evaluation device, which comprises a number of control channels for connecting to and controlling actuators and a number of readback circuit terminals for connecting to the auxiliary contacts assigned to the actuators, wherein the control and evaluation device is parameterized and/or can be parameterized in such a way that a number of actuators arranged in the series circuit are each connected by means of a separate control channel to the control and evaluation device and an auxiliary contact is assigned to each actuator and the auxiliary contacts are connected to the control and evaluation device by means of the readback terminals via at least one readback circuit, wherein, only for deactivated actuators, to which a common readback circuit is assigned, by which means a standby signal can be detected as a readback signal by the control and evaluation device, for the control of actuators arranged in series, for their activation initially with reference to at least one readback circuit, only one actuator belonging to this readback circuit is always activated and the readback signal detected by means of the readback circuit assigned to this actuator is evaluated before at least one of the last of the actuators arranged in series in the load circuit can be activated.

Activation of the actuators is initiated at two or more different time points, or time-displaced. Significant advantages are thus already to be seen in that, through the solutions according to the invention, the functions of individual actuators can be tested separately and at essentially any time without control signals required for this purpose being visible on the output. Thus, it is possible to perform tests of function-oriented switching implicitly, i.e., continuously during use specific to the application according to certain settings, and/or explicitly, i.e., through intentional initiation.

According to first preferred embodiments, the auxiliary contacts, preferably every two auxiliary contacts, are connected in a series circuit for forming a common readback circuit to the control and evaluation device, so that, in this way, the activation of each actuator to which a common readback circuit is assigned is initiated at a different point in time.

According to second preferred embodiments, each auxiliary contact is connected to the control and evaluation device by means of a separate readback circuit, wherein it is further preferably provided that the separate readback circuits can be coupled with each other like a series circuit for evaluation.

Parameterization of the control and evaluation device is preferred, according to which, for requested activation of all of the actuators before the activation of all of the actuators and/or for a non-required activation of all of the actuators, at least one actuator always remains deactivated and wherein, with reference to at least one readback circuit, only one actuator belonging to this readback circuit is controlled alternately for activation and deactivation, wherein, in the meantime, all of the actuators belonging to this readback circuit remain deactivated and the corresponding readback signal detected by means of the readback circuit is evaluated. If the auxiliary contacts are each connected by means of a separate readback circuit, the number of other actuators belonging to the corresponding readback circuit equals zero. In these embodiments, because at least one actuator always remains deactivated, test sequences can be performed not only with respect to their switching functionality but also with respect to their switch-off functionality, without a signal being visible on the output.

To keep the wear on the actuators as low as possible, preferably for each required activation process, all of the actuators connected in series in the load circuit are shut off with the activation of an actuator, which, in the preceding activation process of all of the actuators, was not the last that was activated for this purpose. If only two actuators are present, then each of the actuators is loaded alternately and thus uniformly.

Moreover, with reference to at least one readback circuit, for the corresponding activation of only one actuator belonging to a readback circuit and/or for shutting down all of the actuators belonging to a common readback circuit, refinements perform the comparison of the reaction time of a signal change detected by means of the corresponding readback circuit with a predefined time window. For this purpose, the control and evaluation system comprises a correspondingly constructed comparison device.

Furthermore, it is advantageous that the control and evaluation system according to the invention integrates the control and evaluation device, the readback circuit, and the actuators in a housing and/or comprises individual modular units connected to each other.

In particular, the control and evaluation device is or will be parameterized in such a way that, with respect to at least one readback circuit, for the corresponding activation of only one actuator belonging to a readback circuit and/or for shutting down all of the actuators belonging to a common readback circuit, the readback signal detected by means of the corresponding readback signal is evaluated.

It is further advantageous when the control and evaluation device can be controlled from the outside for initiating at least one activation process.

Consequently, advantages achieved by the invention are also to be seen in that the switching as such and/or reaction times of the actuators can be tested in the field and preferably each also directly before execution of a requested safety function. Thus, it is further enabled by the invention to also reliably test the actuators in terms of their function-specific control behavior at essentially any point in time.

Incorrect connections, including wiring errors and also incorrect reaction times, in particular, shutdown times, can thus be recognized with extreme reliability before the next safety requirement and corresponding reactions can be initiated in due time, e.g., the load circuit is brought into a safe state.

Another advantage is that the parameterizable control and evaluation device can perform a plurality of different test cycles or sequences for testing each of the actuators specific to the application and that, consequently, the circuit according to the invention allows a flexible, multi-purpose use also for different environmental conditions.

Thus, the subject matter according to the invention can preferably be used in safety engineering and/or for controlling an actuator-protecting switch element, e.g., a relay, contactor, or motor.

In summary, it can be noted as particularly advantageous that function testing of the actuators is enabled individually and before activation of all of the actuators required for switching the load, that wiring tests can be performed implicitly, e.g., at essentially any point in time, or explicitly, i.e., through intentional activation of a test sequence, that wiring errors can be recognized before the next safety requirement, i.e., before the next required switching of the load, and that, in addition, impermissible shutdown times can be recognized before the next safety requirement.

BRIEF DESCRIPTION OF THE DRAWINGS

The invention will be described in more detail below using a preferred embodiment with reference to the enclosed drawings. In the drawings:

FIG. 2 is an example flow chart of test sequences according to the invention for error-free operation based on an arrangement according to FIG. 1, FIG. 4 is an example flow chart of test sequences according to the invention for error-free operation based on an arrangement according to FIG. 3.

DETAILED DESCRIPTION

Figure 1:
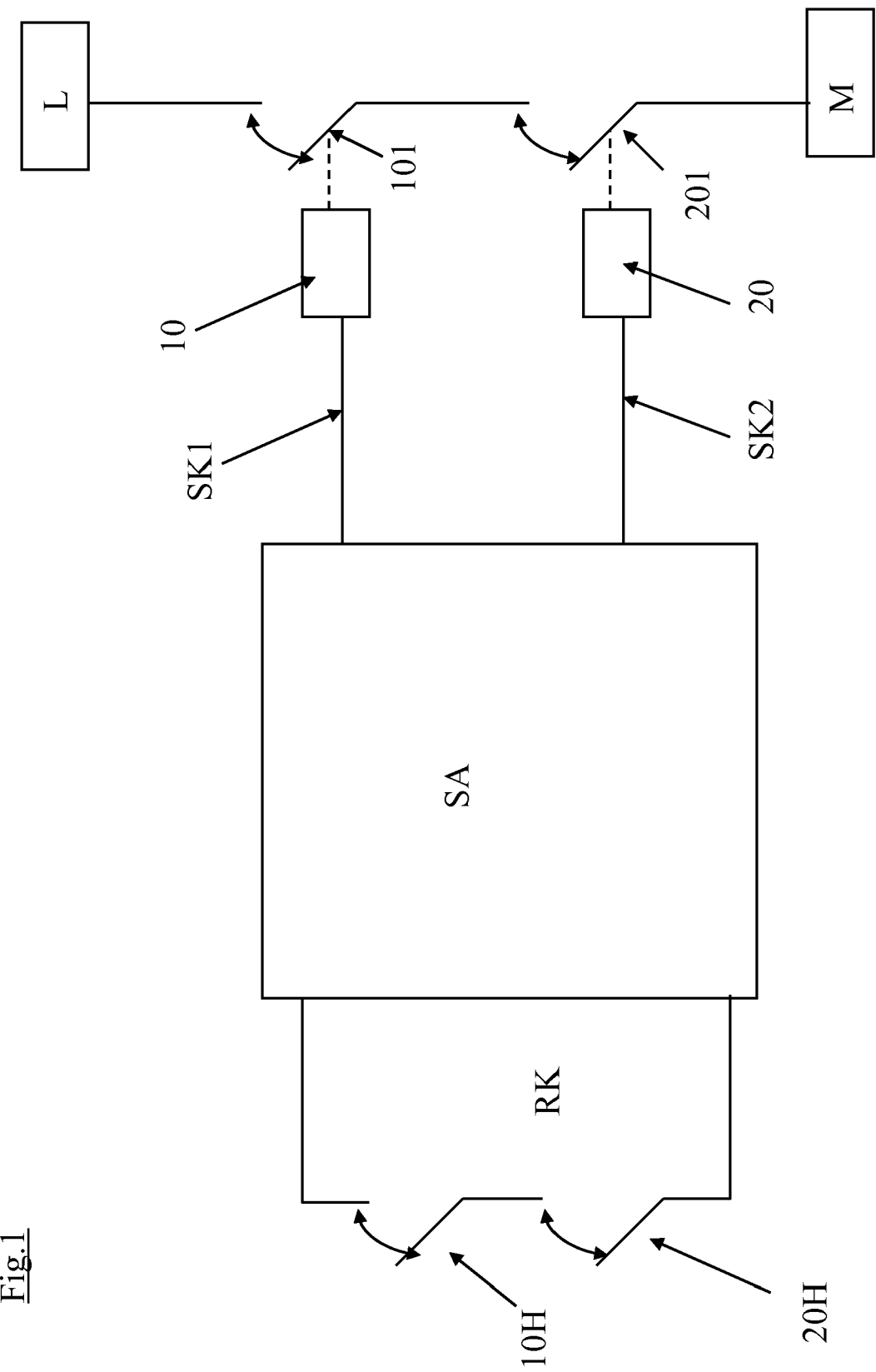
FIG. 1 is a configuration of an example arrangement of a control and evaluation system according to the invention.

Below, reference will first be made to FIG. 1, which shows, in the shown example, a first arrangement of a control and evaluation system according to the invention for the output of safety-relevant signals to two actuators for switching a two-channel load circuit to be controlled by means of these actuators in an output circuit not shown in more detail.

The load circuit comprises a motor M and a load L that can be electrically connected to this motor via a signal path. In the signal path to be connected for this purpose, two actuators are arranged in series, wherein each actuator in the present example has a driver unit, e.g., contactor coils 10 or 20, and closing means, e.g., contactor contacts 101 or 201. If the coil 10 or 20 is activated, the contactor contacts 101 or 201 close. Due to the series arrangement within the load circuit, however, the load L is first electrically connected to the motor M, and thus the signal path is closed when both coils 10 and 20 are activated and thus all of the contactor contacts are closed. Otherwise, the signal path is broken and the load is deactivated. If the signal path to be closed has a multi-phase construction, each actuator preferably also has a corresponding number of closing means.

The control and evaluation system further comprises a control and evaluation device SA, which has two control channels SK1 and SK2, wherein each driver unit 10 and 20 is separately connected to the control and evaluation device via a control channel SK1 and SK2, respectively, for control by the control and evaluation device.

Each actuator further has an auxiliary contact 10H or 20H, each of which is respectively assigned to one of the driver units 10 or 20 and connected to the control and evaluation device via a series circuit and which together form a common readback circuit RK. For proper connection to the control and evaluation device SA, the auxiliary contacts 10H and 20H are connected to the driver unit 10 or 20 via the control and evaluation device, and the control and evaluation device is parameterized such that, in the case when both actuators are not activated, a standby signal can be detected by the control and evaluation device by means of the readback circuit, e.g., in the form of a standby current.

If at least one actuator 10 or 20 is activated and thus controlled accordingly by the control and evaluation device, a change in signal can be detected by the control and evaluation device via the readback circuit, e.g., the corresponding assigned auxiliary contact 10H or 20H then opens, so that a signal is no longer applied or a zero signal is applied via the readback circuit. A change in signal is performed in the reverse direction, i.e., when the last actuator, which is assigned to the readback circuit, is deactivated. For error-free operation or functioning of the actuators, such a change in signal is further performed within a predetermined time. The control and evaluation unit SA therefore preferably has a comparison device not shown explicitly in FIG. 1, which compares the reaction times for a required change in signal with predetermined times or time windows.

The monitoring, and thus the testing, of the actuators assigned to a common readback circuit, including the switching, is performed, in that the driver units 10 and 20 of the actuators are activated with a time displacement, i.e., never at the same time, and preferably alternately, so that monitoring is also performed before each subsequent safety request, i.e., when all of the actuators belonging to a readback circuit are activated. In this way, to test all of the actuators, it is therefore preferable to connect a common readback circuit. Therefore, first, diagnosis with one hundred-percent error coverage in the readback circuit of the circuit can be realized without leading to negative effects on the load and, second, the wear is distributed uniformly due to alternating activation.

The parameterizable control and evaluation device SA can now be parameterized in such a way that defined sequences can be performed for safe monitoring of the actuators, i.e., the switching of the actuators including the corresponding activation of common readback circuits and also the reaction times of the actuators as a result of their activation and/or deactivation, at essentially any point in time, without this being visible on the output and thus on the load circuit. If the monitoring leads to the recognition of an error, the reactions and measures corresponding to each application and safety request can be initiated in real time.

Performing defined sequences can be parameterized rigidly in the control and evaluation device, so that these sequences are performed, e.g., implicitly during the use of the actuators according to regulations. The parameterization of the control and evaluation device for performing defined sequences and/or the initiation of defined sequences can also be realized, however, e.g., by means of another modular unit, e.g., an FB entity, which can be connected to the control and evaluation device, so that certain sequences to be performed can also be set or selected, e.g., explicitly, that is, intentionally.

This is especially preferred when the components shown in FIG. 1 are indeed optionally integrated in a housing, but, in principle, can have a modular assembly.

In this way, as shown below with reference to example sequences, errors in the wiring, e.g., unconnected or incorrectly connected or also bridged auxiliary contacts, can be easily recognized. Furthermore, through the application of the invention, errors in the other peripherals can be easily recognized, e.g., due to actuators decoupled from the load branch. Manipulation of the readback circuit can also be discovered immediately. The risk that such errors remain undiscovered and the loss of the requested safety function by a common-cause error are thus essentially ruled out.

Below, three preferred sequences for monitoring the actuators of the two-channel connected safety-related load circuit based on the construction of the invention shown above will be described. As a general rule in this case, the load circuit is to be driven to a safe state for recognition of an error, but this is not discussed in detail.

In a first method for monitoring the actuators, an even lower safety level is the decisive feature. First, both driver units 10 and 20 are in the deactivated and thus uncontrolled state. For the sake of simplicity, such a state is designated below as "OFF." As discussed above, in the case when both driver units 10 and 20 are not controlled and the actuators are not activated, a standby signal can be detected by means of the readback circuit. For the sake of simplicity, such a state of the readback signal is defined below as "TRUE."

If a driver unit is controlled and thus the actuator is activated, for the sake of simplicity this state is designated below as "ON." In this case, for error-free functioning, a change in signal is performed by means of the readback circuit and thus a signal state designated below as "FALSE" can be detected.

For error-free operation, a change in signal from "TRUE" to "FALSE" must then always be set if initially both actuators are at "OFF" and an actuator is triggered to the "ON" state. In the opposite case, for error-free functioning, a change in signal from "FALSE" to "TRUE" is always to be set when initially one actuator is triggered to the "ON" state and then both actuators are allowed to go to "OFF."

In addition, this change in signal should be performed within set reaction times, so that a maximum permissible reaction time is also preferably monitored by the invention for error-free operation. Consequently, based on the application, preferably at least the monitoring of the reaction time is provided as a function within a defined time window, if initially all of the actuators belonging to a readback circuit are at "OFF" and then one of these actuators is triggered to the "ON" state, or if initially at least one of the actuators belonging to a readback circuit is triggered to the "ON" state and then all of these actuators are allowed to go to "OFF."

In the first method, initially both driver units 10 and 20 are thus "OFF" and the readback signal is "TRUE."

Now let it be assumed that the connected load L is to be activated and thus the corresponding safety function of the actuators is required and consequently both actuators must be activated.

As described above, the activation process is performed in time-displaced and preferably alternating fashion, i.e., in this pending requirement, e.g., the driver unit 10 is first controlled and at the next request from a common "OFF" state, the driver unit 20 is first controlled. It shall be assumed that the driver unit changes from "OFF" to "ON." Consequently, the readback signal must change from "TRUE" to "FALSE." If the maximum permissible reaction time is exceeded, the corresponding actuator is defective. If there is no change in the state of the readback circuit, the wiring is defective. In both cases, errors are recognized.

Then, for error-free operation, the driver unit 20 is changed from "OFF" to "ON." The readback signal thus remains at "FALSE." At the end of the request for the safety function, both actuators are set to "OFF" and the readback signal (RS) consequently must change to "ON."

In this state, optionally each actuator and its wiring can be tested separately. For the next safety function request, initially the driver unit 20 is controlled as the first.

In summary, e.g., the following test sequence is given, wherein, for error-free operation, the next sequence is initiated and otherwise an error is recognized.

| Sequence | 10 | 20 | RS | Comment |
|---|---|---|---|---|
| 1 | OFF | OFF | TRUE | Both actuators off |
| 2 | ON or | OFF | FALSE | Request for safety function: Turn on both actuators; however, change the sequence in a time-displaced way and preferably for each request |
|  | OFF | ON | FALSE |  |
| 3 | ON | ON | FALSE | Both actuators on |
| 4 | OFF | OFF | TRUE | Both actuators off |
| 5 | ON | OFF | FALSE | Actuators are optionally turned on and off again alternately, wherein one always remains turned off |
|  | OFF | ON |  |  |

In other words, in this way, before activation of both actuators, at least one is tested separately again for error-free operation with respect to activation functionality.

In a second method for testing the connected actuators, a medium safety level is the decisive feature. If the load L is to be activated, in modification to the first method, an actuator is triggered "ON" and, for error-free operation, again triggered "OFF" and then the other actuator is set to "ON" and, for error-free operation, the first actuator is also set to "ON." After the end of the safety request, both actuators are allowed to go back to "OFF." In summary, e.g., the following test sequence is given, wherein, for error-free operation, the next sequence is initiated and otherwise an error is recognized.

| Sequence | 10 | 20 | RS | Comment |
|---|---|---|---|---|
| 1 | OFF | OFF | TRUE | Both actuators off |
| 2-a | ON | OFF | FALSE | Request for safety function: Turn on both actuators; however, for each turn-on process, both actuators are tested separately for their activation |
| 2-b | OFF | OFF | TRUE |  |
| 2-c | OFF | ON | FALSE | The sequence 2-a to 2-c is changed optionally for each turn-on process |
| 3 | ON | ON | FALSE | Both actuators on |
| 4 | OFF | OFF | TRUE | Both actuators off |
| 5 | ON | OFF | FALSE | Actuators are optionally turned on and off again alternately, wherein one always remains turned off |
|  | OFF | ON |  |  |

In other words, here, before activation of both actuators, these are each tested again separately for error-free operation with respect to activation functionality.

In a third method for testing the connected actuators, a high safety level is the decisive feature.

Initially, both driver units 10 and 20 are set, in turn, to "OFF." If the load L is to be activated, in another modification, an actuator is set to "ON," for error-free operation set back to "OFF" and then the other actuator is set to "ON" and, for error-free operation, initially also set back to "OFF." Only then is the activation process of both actuators initiated alternately.

After the end of the safety requirement, both actuators are allowed to go back to "OFF." In summary, e.g., the following test sequence also shown in FIG. 2 is given, wherein, for error-free operation, the next sequence is initiated and otherwise an error is recognized.

| Sequence | 10 | 20 | RS | Comment |
|---|---|---|---|---|
| 1 | OFF | OFF | TRUE | Both actuators off |
| 2-a | ON | OFF | FALSE | Request for safety function: Turn on both actuators; however, for each turn-on process both actuators are tested separately for their activation and deactivation |
| 2-b | OFF | OFF | TRUE |  |
| 2-c | OFF | ON | FALSE | The sequence 2-a to 2-d is optionally changed for each turn-on process |
| 2-d | OFF | OFF | TRUE |  |
| 3-a | ON or | OFF | FALSE | Turn on actuators, but change |
|  | OFF | ON | FALSE | sequence for each turn-on process |
| 3-b | ON | ON | FALSE | Both actuators on |
| 4 | OFF | OFF | TRUE | Both actuators off |
| 5 | ON | OFF | FALSE | Actuators are optionally turned on and off again alternately, wherein one always remains turned off |
|  | OFF | ON |  |  |

In other words, here, before their activation, both actuators are each tested again separately for error-free operation both with respect to activation functionality and with respect to deactivation functionality. In this way, before the execution of a required safety function, every error that actually occurs, including at the shutdown time, is recognized.

In principle, however, the (optional) cyclical testing of the shutdown time of the connected actuators guarantees the reaction time required in a safety-related application. Through a defined alternating activation sequence in the safety function request, actuator wear is uniformly distributed during the activation process. Thus, with the application of the invention, error exclusions can be essentially eliminated, so that due to the high degree of safety-related diagnostics, the actuators can be used in the field or in the switching cabinet without further measures.

It is obvious to someone skilled in the art that the parameterization according to the invention can be performed in hardware and/or software.

Also, it is not necessary to first activate both actuators in order to recognize an error, which offers, e.g., an essential advantage relative to the TC5-PLCopen specification or EDM functional components. Furthermore, the configuration of a modular system is also possible with different safety levels, including wiring testing that can be selected explicitly. In addition, implicit wiring testing can always be guaranteed. A previously necessary, intentional error construction and deconstruction is eliminated. Despite the apparently critical series connection in the readback circuit, a precise position diagnosis of errors occurring there is guaranteed and errors that previously remained unrecognized are reliably discovered.

Below, FIG. 3 will now be referenced, which, in the shown example, shows another arrangement according to the invention. For the sake of simplicity, reference symbols for essentially corresponding components were maintained. Modifications with respect to the embodiment described in FIG. 1 will be discussed below.

Figure 3:
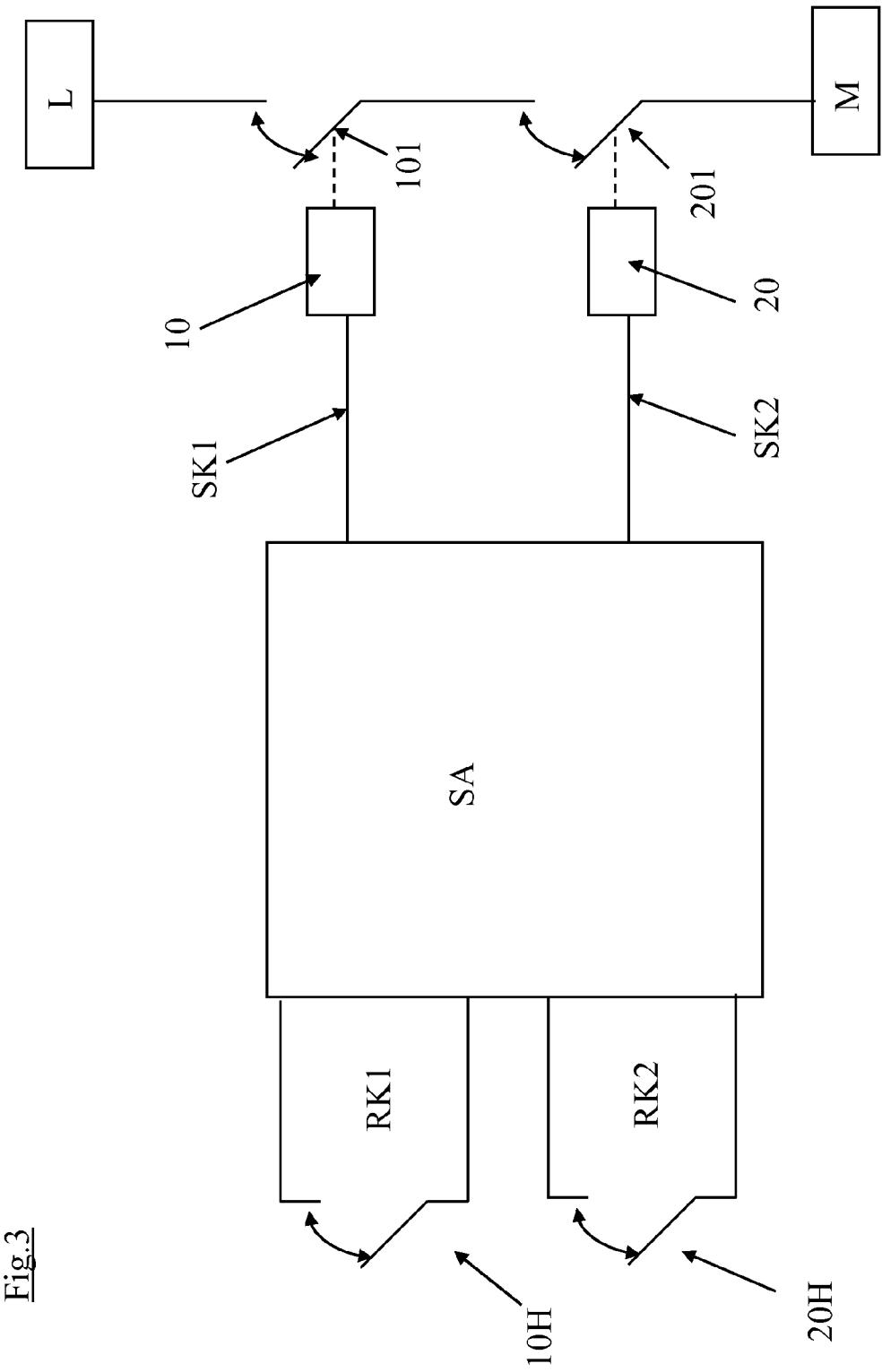
FIG. 3 is another configuration of an example arrangement of a control and evaluation system according to the invention.

In a modification to FIG. 1, each actuator according to FIG. 3 has auxiliary contacts 10H and 20H, which are assigned to the driver units 10 and 20, respectively, and which are now connected to the control and evaluation device by means of a separate readback circuits RK1 and RK2, respectively. Indeed, for this purpose, an increased number of interfaces corresponding to the increased number of readback circuits must be provided in the control and evaluation device; on the other hand, specific to the application, this can then also be constructed and/or parameterized to evaluate the separate readback circuits RK1 and RK2 with reference to their separate readback signals, also designated as RS1 and RS2 below or by means of a common readback signal through evaluation of the readback circuits RK1 and RK2 with a series circuit provided by the control and evaluation device SA. The readback circuits are thus coupled to each other like a series circuit. For their proper connection to the control and evaluation device SA, the auxiliary contacts 10H and 20H are connected to the driver unit 10 or 20, so that a standby signal can be detected by means of a readback circuit when the corresponding actuator is not activated. Also in these embodiments, with respect to at least one readback circuit, initially only one actuator 10, 101 or 20, 201 belonging to this readback circuit is always activated and the readback signal detected by means of the readback circuit RK1 or RK2 assigned to this actuator is evaluated, wherein at least one of all of the actuators arranged in series in the load circuit remains deactivated at least as long. If the actuator 10, 101 is activated, consequently the actuator 20, 201 remains deactivated at least up to the completed evaluation and vice versa.

Furthermore, when the actuator 10, 101 or 20, 201 is activated and thus is controlled accordingly by the control and evaluation device, a change in signal can be detected by the control and evaluation device by means of the corresponding readback circuit RK1 or RK2. Accordingly, a change in signal is performed in the reverse direction, in contrast to FIG. 1, for each deactivation of an actuator.

Thus, the parameterizable control and evaluation device SA can now be parameterized in such a way that, in addition to the actuator monitoring listed above with reference to sequences defined in FIG. 1, further expanded wiring testing is enabled, in particular, in the region of coil wiring, because a separate readback signal can be assigned to each actuator in the control and evaluation unit.

Thus, e.g., additional errors in the hardware can be recognized in the signal path for controlling coils (such as conductor short circuit, cross connection, common cause), as well as errors due to manipulation of the control of coils or errors that are produced during the operative use in the signal path for control. Because errors can be recognized in the control, the expense in the validation of a safety function by the user is again reduced and evaluation by means of separate readback signals allows even more precise diagnosis in the direction of the user.

Below, three preferred sequences will be described in turn, but for one arrangement according to FIG. 3.

In a first method, in turn, the still low safety level is the decisive feature and initially both driver units 10 and 20 are back in the "OFF" state and both readback signals RS1 and RS2 are set to "TRUE." Thus, during modification, a change in signal from "TRUE" to "FALSE" with respect to each readback signal for error-free operation is then always set when the corresponding associated actuator is triggered from "OFF" to "ON." In the opposite case, a change in signal from "FALSE" to "TRUE" for error-free operation must always be set then with respect to a readback signal, when the corresponding actuator is allowed to go from "ON" to "OFF."

Let it be assumed that the driver unit 10 changes from "OFF" to "ON." Consequently, the readback signal RS1 of the readback circuit RK1 must change from "TRUE" to "FALSE." Then, for error-free operation, the driven unit 20 is set from "OFF" to "ON." Thus, the readback signal RS1 remains at "FALSE" and the readback signal RS2 of the readback circuit RK2 must change from "TRUE" to "FALSE." After the end of the safety function request, both actuators are set to "OFF" and both readback signals consequently must change to "ON." Thus, in summary, during modification, e.g., the following test sequence is produced, wherein, for error-free operation, the next sequence is initiated and otherwise an error is recognized.

| Sequence | 10 | 20 | RS1 | RS2 | Comment |
|---|---|---|---|---|---|
| 1 | OFF | OFF | TRUE | TRUE | Both actuators off |
| 2 | ON or OFF | OFF ON | FALSE | TRUE FALSE | Request for safety function: Turn on both actuators; however, change the sequence in a time-displaced way and preferably at each requirement |
| 3 | ON | ON | FALSE | FALSE | Both actuators on |
| 4 | OFF | OFF | TRUE | TRUE | Both actuators off |
| 5 | ON OFF | OFF ON | FALSE TRUE | TRUE FALSE | Actuators are optionally turned on and off again alternately, wherein one always remains turned off |

In a second method, the medium safety level is the decisive feature and, in summary, thus produces, e.g., during modification, the following test sequence.

| Sequence | 10 | 20 | RS1 | RS1 | Comment |
|---|---|---|---|---|---|
| 1 | OFF | OFF | TRUE | TRUE | Both actuators off |
| 2-a | ON | OFF | FALSE | TRUE | Request for safety function: Turn on both actuators; however, for each turn-on process, both actuators are tested separately for their activation |
| 2-b | OFF | OFF | TRUE | TRUE | |
| 2-c | OFF | ON | TRUE | FALSE | The sequence 2-a to 2-c is optionally changed for each turn-on process |
| 3 | ON | ON | FALSE | FALSE | Both actuators on |
| 4 | OFF | OFF | TRUE | TRUE | Both actuators off |
| 5 | ON OFF | OFF ON | FALSE TRUE | TRUE FALSE | Actuators are optionally turned on and off again alternately, wherein one always remains turned off |

In a third modified method, the high safety level is the decisive feature, and, in summary, thus produces, during modification, e.g., the following test sequence also shown in FIG. 4.

| Sequence | 10 | 20 | RS1 | RS2 | Comment |
|---|---|---|---|---|---|
| 1 | OFF | OFF | TRUE | TRUE | Both actuators off |
| 2-a | ON | OFF | FALSE | TRUE | Request for safety function: Turn on both actuators; However, for each turn-on process, both actuators are tested separately for their activation and deactivation |
| 2-b | OFF | OFF | TRUE | TRUE | |
| 2-c | OFF | ON | TRUE | FALSE | The sequence 2-a to 2-d is optionally changed for each turn-on process |
| 2-d | OFF | OFF | TRUE | TRUE | |
| 3-a | ON or OFF | OFF ON | FALSE TRUE | TRUE FALSE | Turn on actuators, however, change the sequence for each turn-on process |
| 3-b | ON | ON | FALSE | FALSE | Both actuators on |
| 4 | OFF | OFF | TRUE | TRUE | Both actuators off |
| 5 | ON OFF | OFF ON | FALSE TRUE | TRUE FALSE | Actuators are optionally turned on and off again alternately, wherein one always remains turned off |

It is obvious to someone skilled in the art that the parameterization according to the invention can be performed, in principle, in hardware and/or software.

Also, it is not necessary to first activate both actuators in order to recognize an error, which offers, e.g., a significant advantage relative to the TC5-PLCopen specification or EDM functional components. Furthermore, the configuration of a modular system is also possible with different safety levels, including wiring testing that can be selected explicitly. In addition, implicit wiring testing can always be guaranteed. A previously necessary, intentional error construction and deconstruction is eliminated. In the control channels and in the readback circuits, a precise position diagnosis of errors occurring there is guaranteed and errors that previously remained unrecognized are reliably discovered.

The invention claimed is:

1. Method for testing actuators arranged in the load circuit of an output circuit for switching the load circuit, the method comprising:
providing a plurality of actuators (10, 101; 20, 201) arranged in series in the load circuit, wherein each of the actuators is connected to a control and evaluation device (SA) by means of a separate control channel (SK1; SK2) for individual control; and
assigning an auxiliary contact (10H; 20H) to each actuator (10, 101; 20, 201);
wherein the auxiliary contacts are connected to the control and evaluation device by means of at least one readback circuit (RK, RK1, RK2), such that only for the deactivation of all of the actuators assigned to each readback circuit, a standby signal is detected by means of this readback circuit as a readback signal by the control and evaluation device, and
wherein the control and evaluation device is parameterized in such a way that the control of actuators arranged in series in the load circuit comprises, for their activation, the steps that, with reference to at least one readback circuit, initially only one actuator belonging to this readback circuit is always activated and the readback signal detected by means of the readback circuit assigned to this actuator is evaluated and at least one of all of the actuators arranged in series in the load circuit remains deactivated at least this long.

2. Method according to claim 1, wherein the control and evaluation device is parameterized in such a way that, for the required activation of all of the actuators, before the activation of all of the actuators and/or, for the non-required activation of all of the actuators, at least one actuator always remains deactivated and wherein, with reference to at least one readback circuit, only one actuator belonging to this readback circuit is controlled alternately for activation and deactivation, wherein, in the meantime, all of the other actuators belonging to this readback circuit remain deactivated and the corresponding readback signal detected by means of the readback circuit is evaluated.

3. Method according to claim 1, further characterized in that, for each required activation process, all of the actuators connected in series in the load circuit are shut down with the activation of an actuator, which, in the preceding activation process of all of the actuators, was not the last that was activated for this purpose.

4. Method according to claim 1, wherein, with reference to at least one readback circuit, for each activation only one actuator belonging to a readback circuit and/or, for turning off all of the actuators belonging to a common readback circuit, the readback signal detected by means of the corresponding readback circuit is evaluated.

5. Method according to claim 1, wherein, in reference to at least one readback circuit, for corresponding activation only one actuator belonging to a readback circuit and/or, for turning off all of the actuators belonging to a common readback circuit, the reaction time of a change in signal detected by means of the corresponding readback circuit is compared with a predefined time window.

6. Method according to claim 1, wherein auxiliary contacts, preferably every two auxiliary contacts, are connected to the control and evaluation device in a series circuit for forming a common readback circuit (RK).

7. Method according to claim 1, wherein each auxiliary contact is connected to the control and evaluation device by means of a separate readback circuit (RK1, RK2).

8. Method according to claim 7, wherein the separate readback circuits are coupled to each other for evaluation in a type of series circuit.

9. Control and evaluation system for testing actuators (10, 101; 20, 201) arranged in series in the load circuit of an output circuit for switching the load circuit, the system comprising:
a control and evaluation device, wherein each of the actuators is connected to the control and evaluation device (SA) by means of a separate control channel (SK1; SK2) for individual control; and
a plurality of auxiliary contacts, wherein each auxiliary contact (10H; 20H) is assigned to a different actuator;
wherein the auxiliary contacts are connected to the control and evaluation device by means of at least one readback circuit (RK, RK1, RK2); only for deactivation of all of the actuators assigned to each readback circuit, a standby signal can be detected by means of this readback circuit as a readback signal by the control and evaluation device, and
wherein the control and evaluation device is parameterized and/or can be parameterized; in the control of actuators arranged in series in the load circuit, only one actuator belonging to this readback circuit can always be activated for their activation initially with respect to at least one readback circuit, and the readback signal detected by means of the readback circuit assigned to this actuator is to be evaluated before at least the last of the actuators arranged in series in the load circuit can be activated.

10. Control and evaluation system according to claim 9, wherein the control and evaluation device is parameterized and/or can be parameterized in such a way that for the required activation of all of the actuators, before the activation of all of the actuators and/or for non-required activation of all of the actuators, at least one actuator always remains deactivated and wherein, with respect to at least one readback circuit, only one actuator belonging to this readback circuit can be controlled alternately for activation and deactivation and the corresponding readback signal detected by means of the readback circuit is to be evaluated, wherein, in the meantime, all of the other actuators belonging to this readback circuit remain deactivated.

11. Control and evaluation system according to claim 9, further characterized in that the control and evaluation device is parameterized and/or can be parameterized in such a way that each required activation process of all of the actuators connected in series in the load circuit are to be shut down with the activation of one actuator, which was not the last that had been activated for this purpose in the preceding activation process.

12. Control and evaluation system according to claim 9, wherein the control and evaluation device, the readback circuit, and the actuators are integrated in a housing and/or are individual module units that can be connected to each other.

13. Control and evaluation system, according to claim 9, wherein the control and evaluation device is parameterized and/or can be parameterized, with respect to at least one readback circuit, for the corresponding activation of only one actuator belonging to a readback circuit and/or for turning off all of the actuators belonging to a common readback circuit to evaluate the readback signal detected by means of the corresponding readback circuit.

14. Control and evaluation system according to claim 9, wherein it comprises a comparison device, which compares, with respect to at least one readback circuit, for the corresponding activation of only one actuator belonging to a readback circuit and/or for shutting down all of the actuators belonging to a common readback circuit, the reaction time of a change in signal detected by means of the corresponding readback circuit with a predefined time window.

15. Control and evaluation system according to claim 9, wherein auxiliary contacts, preferably every two auxiliary contacts, are connected in a series circuit for forming a common readback circuit (RK) with the control and evaluation device.

16. Control and evaluation system according to claim 9, wherein each auxiliary contact is connected by means of a separate readback circuit (RK1, RK2) to the control and evaluation device.

17. Control and evaluation system according to claim 16, wherein the control and evaluation device is constructed and/or can be constructed for coupling, in the manner of a series circuit, to read back circuits separately to it, for evaluation.

18. Control and evaluation system according to claim 9, wherein the control and evaluation device can be controlled from the outside for initiating at least one activation process.

19. Control and evaluation device for a system according to claim 9, with
- a plurality of control channels (SK1; SK2) for connecting to and controlling actuators and with
- a plurality of readback circuit terminals for connecting auxiliary contacts assigned to the actuators,
- wherein the control and evaluation device is parameterized and/or can be parameterized in such a way that if a plurality of actuators (10, 101; 20, 201) arranged in a series circuit are each connected by means of a separate control channel to the control and evaluation device and an auxiliary contact is assigned to each actuator and the auxiliary contacts are connected to the control and evaluation device by means of the readback circuit terminals via at least one readback circuit,
- wherein only for deactivated actuators, to which a common readback circuit is assigned, a standby signal can be detected, via the latter circuit, by the control and evaluation device as a readback signal; for the control of actuators arranged in series, for their activation, initially with respect to at least one readback circuit, only one actuator belonging to this readback circuit is always activated and the readback signal detected by means of the readback circuit assigned to this actuator is evaluated before at least the last of the actuators arranged in series in the load circuit can be activated.

* * * * *